United States Patent
Douskey et al.

(10) Patent No.: US 9,575,120 B2
(45) Date of Patent: *Feb. 21, 2017

(54) SCAN CHAIN PROCESSING IN A PARTIALLY FUNCTIONAL CHIP

(71) Applicant: International Business Machines Corporation, Armonk, NY (US)

(72) Inventors: Steven M. Douskey, Rochester, MN (US); Ronald E. Fuhs, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 827 days.

This patent is subject to a terminal disclaimer.

(21) Appl. No.: 13/853,592

(22) Filed: Mar. 29, 2013

(65) Prior Publication Data

US 2014/0298124 A1    Oct. 2, 2014

(51) Int. Cl.
*G01R 31/28* (2006.01)
*G01R 31/3177* (2006.01)
*G06F 11/26* (2006.01)
*G06F 11/22* (2006.01)

(52) U.S. Cl.
CPC ...... *G01R 31/3177* (2013.01); *G06F 11/2236* (2013.01); *G06F 11/26* (2013.01)

(58) Field of Classification Search
CPC ................ G01R 31/28; G01R 31/3177; G01R 31/318572; G06F 11/36; G06F 9/38; G06K 15/12; G06K 15/1247

See application file for complete search history.

(56) References Cited

U.S. PATENT DOCUMENTS

| | | | |
|---|---|---|---|
| 5,150,044 A | * | 9/1992 | Hashizume .... G01R 31/318583 324/750.3 |
| 7,512,837 B1 | | 3/2009 | Flemming et al. |
| 7,624,318 B2 | | 11/2009 | Bieswanger et al. |
| 7,661,050 B2 | | 2/2010 | Huben et al. |
| 7,676,669 B2 | * | 3/2010 | Ohwada ................ G06F 9/5083 713/1 |
| 7,689,884 B2 | * | 3/2010 | Seuring .......... G01R 31/318561 714/724 |
| 2004/0237015 A1 | * | 11/2004 | Abdel-Hafez . G01R 31/318591 714/726 |
| 2006/0200719 A1 | * | 9/2006 | Keller ............ G01R 31/318547 714/732 |

(Continued)

FOREIGN PATENT DOCUMENTS

JP      2005309867 A     4/2005

OTHER PUBLICATIONS

Douskey, S., "Scan Chain Processing in a Partially Functional Chip," U.S. Appl. No. 14/825,298, filed Aug. 13, 2015.

*Primary Examiner* — Albert Decady
*Assistant Examiner* — Enamul M Kabir
(74) *Attorney, Agent, or Firm* — Nicholas D. Bowman

(57) ABSTRACT

A method for scanning a partially functional chip. The method may include applying a failed core map to the partially functional chip, bypassing at least one failed core scan chain, based on contents of the failed core map. The method may also include performing comparisons of scan status information to the failed core map and inhibiting movement of scan data of at least one failed core, based on results of the comparisons.

1 Claim, 5 Drawing Sheets

(56) References Cited

U.S. PATENT DOCUMENTS

| | | | | |
|---|---|---|---|---|
| 2008/0091997 A1* | 4/2008 | Osanai | G01R 31/318342 | 714/727 |
| 2008/0288842 A1* | 11/2008 | Waayers | G01R 31/318563 | 714/729 |
| 2009/0019329 A1* | 1/2009 | Aitken | G01R 31/318555 | 714/729 |
| 2009/0119559 A1* | 5/2009 | Foutz | G06F 11/267 | 714/729 |
| 2012/0096314 A1* | 4/2012 | Motika | G06F 11/27 | 714/30 |
| 2013/0179742 A1* | 7/2013 | Tekumalla | G01R 31/318541 | 714/726 |
| 2013/0185607 A1* | 7/2013 | Tekumalla | G01R 31/318558 | 714/726 |

* cited by examiner

SCAN CHAIN PROCESSING IN A PARTIALLY FUNCTIONAL CHIP

TECHNICAL FIELD

The present disclosure relates to semiconductor devices. In particular, this disclosure relates to manufacturing and testing of integrated circuits which include multiple cores.

BACKGROUND

A testing strategy known as "partial good" is increasingly used by integrated circuit (chip) manufacturers in an attempt to increase yields of complex integrated circuits. Partial good methodologies include testing individual sections of chip circuitry, marking them as functional or non-functional (failed), and isolating the non-functional sections to prevent them from interfering with the operation of the functional sections.

Scan latch chains are often used to facilitate access to latches within individual sections of circuitry (cores), and are used to initialize, test, and debug both individual cores as well as the entire chip. Each core typically has a scan chain that includes latches useful for performing functions within the core.

In a partial good strategy, failing circuit elements within a core may require that the core, including its scan latches, be disabled, and that core's section of the scan chain be bypassed. The subsequent bypassing (shortening) of the overall chip scan chain may cause operational difficulties for both the hardware and software external to the chip which manages the chip scan activity.

SUMMARY

One embodiment is directed to a method for scanning a partially functional chip. The method may include applying a failed core map to the partially functional chip, and bypassing at least one failed core scan chain, based on contents of the failed core map. The method may also include performing comparisons of scan status information to the failed core map, and inhibiting movement of scan data of at least one failed core, based on results of the comparisons.

Another embodiment is directed to a scan chain controller which may include a scan chain having utility scan latches. The scan chain controller may also include a bypass logic coupled to the scan chain, an input gating logic coupled to the bypass logic. The scan chain controller may further include an output gating logic coupled to the bypass logic and a set of scan path status and configuration registers operationally coupled to the input gating logic, the bypass logic and the output gating logic.

Embodiments of the invention may mask from a service processor the scan chain length variability of a chip using a partial good core strategy. The service processor and related software complexity may be reduced, enabling a partial good core strategy to be implemented on a chip with reduced implementation expense.

BRIEF DESCRIPTION OF THE DRAWINGS

The drawings included in the present application are incorporated into, and form part of, the specification. They illustrate embodiments of the present invention and, along with the description, serve to explain the principles of the invention. The drawings are only illustrative of embodiments of the invention and do not limit the invention.

In the drawings and the Detailed Description, like numbers generally refer to like components, parts, steps, and processes.

DETAILED DESCRIPTION

Figure 1:
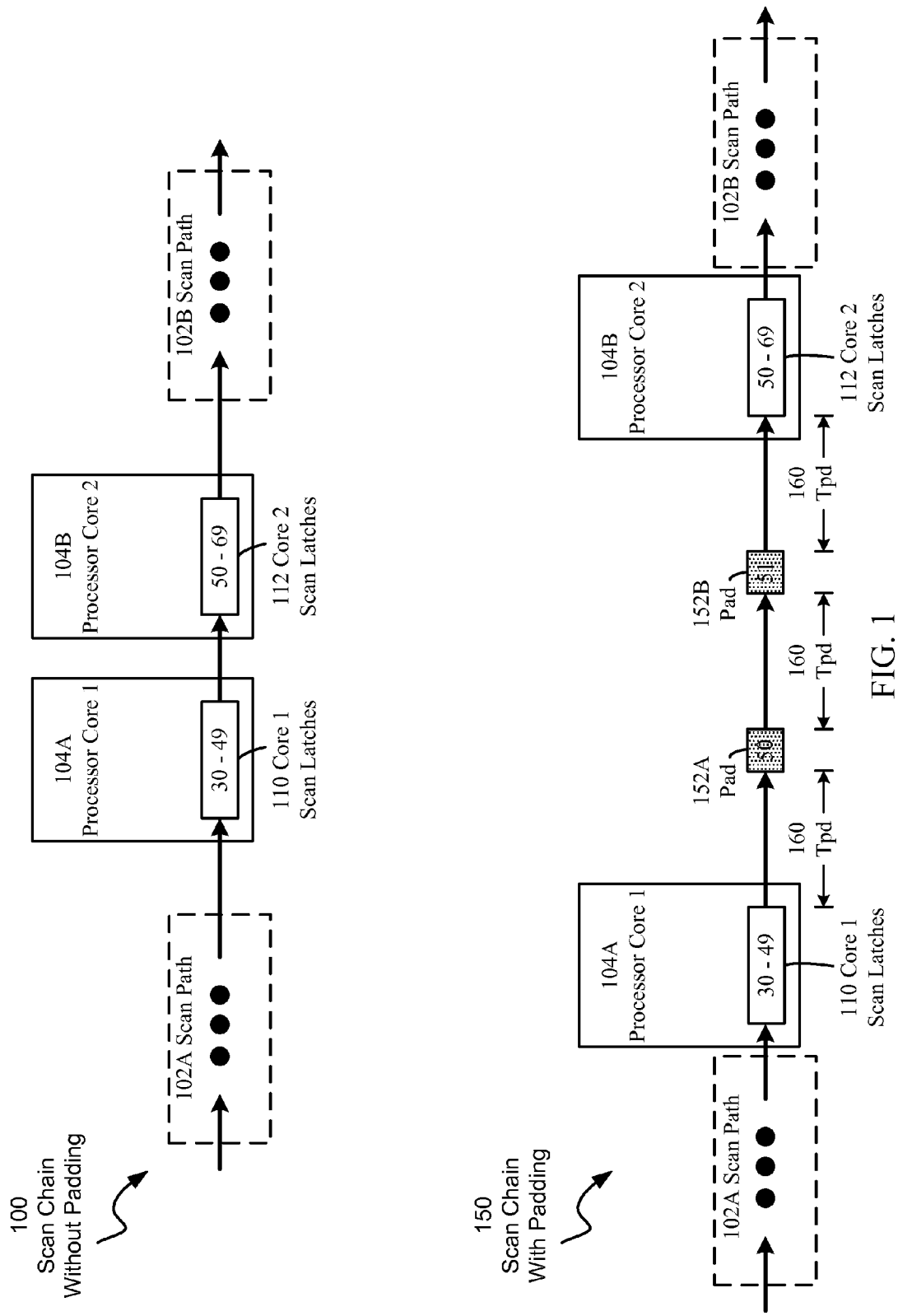
FIG. 1 is a block diagram representation of two configurations of an exemplary scan chain path in a partial good design, according to embodiments of the invention.

In general, the embodiments describe a scan chain controller and a method for scanning a partially functional chip, according to failed core information. A chip according to the invention may offer increased accessibility to dynamically configured scan chains during initialization, debug, and testing.

Advances in integrated circuit technology have enabled simultaneous decreases in integrated circuit (chip) minimum feature size, increases in active devices per unit die area, and increases in die sizes, all trends that are exploited in integrated circuit design. The convergence of these trends has made die more susceptible to manufacturing defects and made achieving desired die yields more difficult.

Another continuing trend has been an increasing number of processor cores designed into each chip, with the intent of enabling concurrent processing on greater amounts of data. The increased number of cores per chip has also contributed to generally lower chip manufacturing yields.

For the purposes of discussion, a core will be defined as any unit of circuitry that may be functionally isolated from the remainder of the chip on which it resides. Functional isolation typically requires the intentional use of design features such as input and output gating. In addition, a single core by itself is not essential to the operation of the entire chip. Examples of cores may include data processing units, sub-sections of a memory circuit, or other sub-components.

A traditional response to chip manufacturing defects has been to discard any die that tested defective in any way, resulting in decreased yields and correspondingly increased per-die costs. In an attempt to increase yields and subsequently lower per-die costs, many integrated circuit manufacturers are now employing a partial good (functional) approach to chip testing.

A partial good chip has all essential circuitry tested as functional and one or more non-essential portions that have tested non-functional. When the chip is known to be a partial good chip, the defective portions of circuitry may be functionally isolated from the functional portion so that a non-functional (failed) core's unknown or incorrect output values cannot cause unpredictable results in functional chip sections. The chip may then be operated at a reduced capacity.

By utilizing a strategy of testing for and marketing partial good chips, chip manufacturers can reduce the scrap cost of defective chips, benefiting from enhanced yields while offering a range of functional capacities of a single integrated circuit design.

As an example, a chip designed with eight processor cores may be useful with as few as two functional cores. By using a partial good strategy, the relatively low yields of chips with eight functional cores can be transformed to higher yields, with chips having a range from two to eight functional processor cores. Chip sorting and pricing in accordance with the chip's functionality level may be employed to maximize revenues.

Latch scan chains are widely employed in the initialization, testing, and debug of complex integrated circuits, as they enable relatively simple and direct access to latches within a chip that otherwise may be difficult or impossible to access. Each core or functional section of the chip has its own scan latches (which may be bypassed if needed). A core's scan latches may be modified by scanning values in, and the scanned in values may be acted on by the core. The core may also modify values of scan latches, which may subsequently be scanned out, read, and analyzed. A service processor or other device outside the chip is often used to manage the scanning of data into and out of the chip.

When a partial good test strategy is applied to complex, multi-core chips, an entire core or possibly even more than one core, may be tested and subsequently marked as defective. The core's defective circuitry may or may not include parts of its latch scan chain. In order to preserve the functionality of the remainder of chip scan chain, the portion of the scan chain within a core must be removed from the chip's scan chain, to prevent incorrect or unknown information originating in the defective core from propagating to the remainder of the chip scan chain. Defective core scan latches may also malfunction so as to disconnect one section of the chip scan chain from another, similar to an open circuit, possibly making functional portions of the chip inaccessible through scanning by the service processor.

The method of removing a section of scan chain from the entire chip scan chain may involve using a multiplexer to bypass that section, effectively shortening the entire chip scan chain. This technique may be used to bypass the scan chains of the individual cores and other partitioned sections of logic from the entire chip scan chain.

An alternate scan path can be any path that circumvents the scan path involving a core's scan chain latches. This may involve but is not limited to a multiplexer that selects one of the core's normal scan chain path and an alternate path.

The variable length scan chains that may be required for implementing a partial good test strategy may cause functional problems for a service processor or other scan management hardware external to the chip. Variable length scan chains may also cause difficulties for software that uses the scan path for diagnostics, initialization and debug. The software complexity may increased, as it may have to contain many scan definitions, or a reconfigurable scan definition may need to be developed to support the many new scan configurations possible when one or more cores are removed from the scan chain.

Embodiments of the invention may mask from a service processor the scan chain length variability of a chip using a partial good core strategy. The service processor and related software complexity may be reduced, enabling a partial good core strategy to be implemented on a chip with reduced implementation expense.

Embodiments of the invention may automatically inhibit latch scan chain shifting during the time window that a service processor is scanning in or out the latch values for an individual failed core.

In an exemplary embodiment, a multi-core chip design may include 8 cores, with each core having 100 scan latches arranged in series in a scan chain. When reading or writing the chip's scan path, a service processor will attempt to scan 800 latches. If one of the cores was marked as failed during manufacturing test, the chip would be configured such that the failed core's latches are bypassed (missing from) the overall chip scan chain.

Using the existing state of the art techniques, a service processor attempting to clock the scan chain 800 times would end up placing data in incorrect latches.

Movement of scan data may be initiated by synchronous (clocked) logic schemes, or by asynchronous (self-timed) schemes. Traditionally scan chains have been synchronously clocked circuits, however other embodiments are envisioned.

According to embodiments of the invention, however, the service processor will clock the scan chain 800 times (no change in operation) and the scan controller hardware effectively blocks 100 clock cycles corresponding to the bypassed scan chain from reaching all the latches in the chip scan chain during the cycles when the service processor would be shifting scan data into or out of the failed core; the scan chain is effectively held stationary for 100 scan clock cycles. The scan in data for the failed core is not shifted in by the chip because the shift clocks are blocked. During a scan out operation the scan chain is similarly not shifted while the failed core's scan latch data would be output from the chip. The scan controller drives a constant logic value out to the service processor, replacing the actual data from the failed core's 100 latches, masking the chip scan chain's changed length from the service processor.

An alternate logic value can be output to the scan chain in place of a failed core's output. An alternate logic value may take the form of a constant value (1s or 0s) or may include some pre-defined pattern of 1s and 0s.

Further embodiments of the invention make use of the techniques of failed core scan chain bypassing, input gating, output gating, and outputting fail bits into scan chain data, in order to mask scan chain length variability of a chip from a service processor.

Further embodiments of the invention may also make use of the techniques of adding scan chain padding to aid in meeting timing requirements when a failed core is removed from the scan chain and outputting constant values, in order to mask chip scan chain length variability of a from a service processor.

Further embodiments of the invention make use of the techniques of filling the failed core(s) scan chain latches with a constant value during scan in, and using scan path status and configuration to control operations above.

FIG. 1 is a block diagram representation of two configurations of an exemplary scan chain path in a partial good design, according to embodiments of the invention.

Scan Chain Without Padding 100 depicts two Processor Cores 104A and 104B, each with a set of Core Scan Latches 110, and 112, respectively. Processor Core 104 is used to refer to processors in general; a letter may be appended (e.g., processor 104B, 104B, and the like) to reference a particular Processor Core 104. Scan Paths 102 may be similarly identified.

Core Scan Latches 110 and 112 each depict a set of 20 scan latches in a series arrangement, as shown by the bit numbers (30-49, and 50-69, respectively) within the illustration. For ease of illustration Core Scan Latches 110 and 112 are shown as a grouped arrangement of scan latches, however core designs may include latches distributed in any manner within the physical boundaries of the core circuits on a chip. One embodiment involves designing similar cores to have an identical number of core scan latches, for ease of scan chain management.

Processor Cores 104A and 104B are arranged adjacent to each other, close enough that the connection path between Core Scan Latches 110 and 112 requires no additional padding latches in order to meet chip-level scan timing requirements.

For simplicity of illustration, Scan Chain Without Padding 100 is an exemplary depiction showing only two adjacent processor cores. An illustration related to FIG. 3 and FIG. 4 would include four adjacent cores, similarly depicted. In the practice of the invention, any number of cores may be placed adjacent to each other, possibly 1,000 or more on an exemplary chip. A similar number of cores may be connected as depicted in Scan Chain With Padding 150, including one or more padding latches 152A, 152B between each connected pair of cores.

Scan Paths 102A and 102B both depict arbitrary portions of an on-chip scan path, having any number of scan latches and other utility latches (discussed in relation to FIG. 2,3,4) arranged in a serial chain. Scan Paths 102A and 102B serve as placeholders for the remainder of a chip scan path.

The scan data proceeds from left to right in the illustration, moving one bit position to the right with each scan clock applied. The progression of scan data for Scan Chain Without Padding 100 is from Scan Path 102A to Processor Core 1 104A to Processor Core 2 104B to Scan Path 102B.

Figure 2:
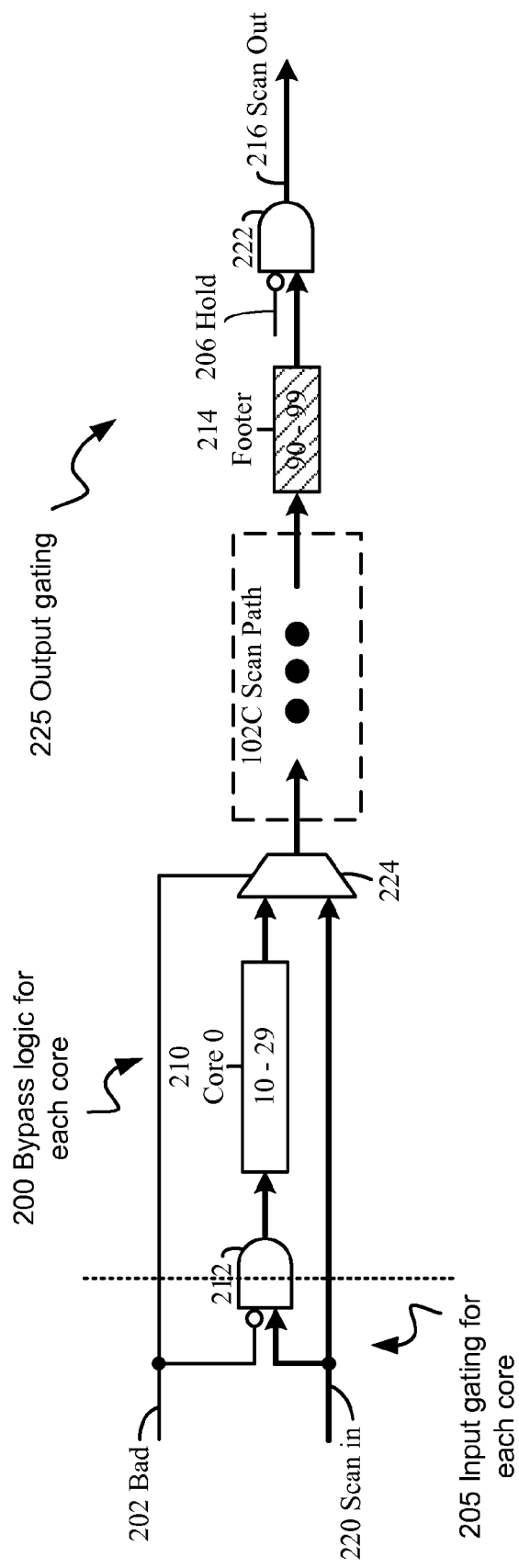
FIG. 2 is a block diagram representation of an exemplary scan path including core bypass logic, input gating and output gating, according to embodiments of the invention.

FIG. 2 is a block diagram representation of an exemplary scan path including a core bypass logic, an input gating and an output gating, according to embodiments of the invention. FIG. 2 depicts modifications to chip scan hardware that support embodiments of the invention, including a Bypass logic 200, an Input gating 205, and an Output gating 225 sections.

Bypass logic 200 is comprised of a Bad 202 signal, a Scan in 220 signal, an AND gate 212, a Core 0 Scan Latches 210, and a MUX 224. When the Bad 202 signal is held at 1, the MUX 224 is used to select Scan in 220 as the input to MUX 224 rather than the output of Scan Latches 210, effectively bypassing Core 0 Scan Latches 210 in the scan path. There may be more than one failing core requiring bypassing; there is a similar arrangement activated for each failing core.

The Input gating 205 is comprised of Bad 202 signal, Scan in 220 signal, and AND gate 212. When the Bad 202 signal is held at 1, based on the contents of a failed core bitmap, the failing core's Core 0 Scan Latches 210 receive and are filled with 0s from the output of leading AND gate 212 preceding each core, during a scan in operation. When the Bad 202 signal is held at 0, the Core 0 210 would be loaded with the scan data then feeds the core following it in the scan chain. If the AND gate 212 was not preceding Core 0 210, then the failing core would be loaded with the same data as the core following it in the scan chain.

This function may be used to scan in 0s during the time period in which the service processor would normally send scan input data to a failed core scan latch. The Input gating 205 illustrates how a core's scan chain may be filled with 0s. Other embodiments are contemplated that would fill a core's scan chain with 1's.

Output gating 225 is comprised of a Hold signal 206, an AND gate 222, and a Scan Out 216. When the Hold signal 206 is a 1, the Scan Out 216 is held at 0. This function may be used to scan out 0s during the time period in which the service processor would normally receive scan outputs from a failed core scan latch.

If the Hold 206 signal is held low, then the last bit of the previous core in the scan chain will be the constant value for the failed core's entire data field. During the time window when the failed core data is scanned out, the scan clocks are also held inactive in order to maintain the data of the previous core in the scan path to be scanned out when the scan resumes after the hold time.

Scan Path 102C is similar to Scan Path 102A, 102B as described in reference to FIG. 1. Footer latches 214 may be used to add delay to the output of Scan Path 102C for overall chip scan path timing.

Figure 3:
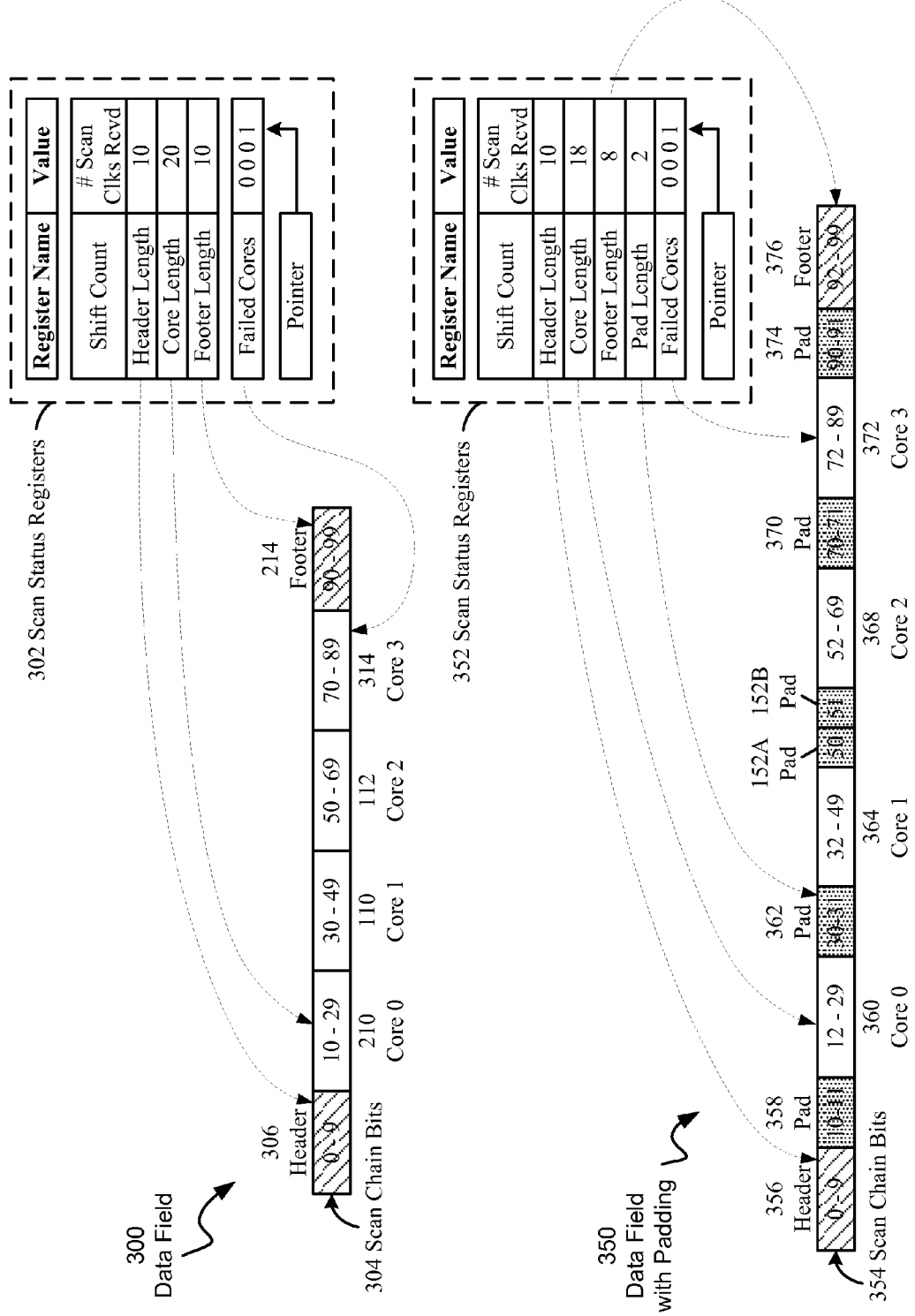
FIG. 3 is a diagram representing two exemplary scan path data fields and associated status and configuration registers, according to embodiments of the invention.

FIG. 3 is a diagram representing two exemplary scan path data fields and their associated status and configuration registers, according to embodiments of the invention.

Data Field 300 depicts a software/firmware view of a scan path data field, which may or may not contain a failed core. Data Field 300 comprises Header 306, Cores Scan Latches 210, 110, 112, 314, and Footer 214. Scan Chain Bits 304 denote the individual scan chain bit numbering within the above listed data field elements.

Data Field with Padding 350 depicts another software/firmware view of data field, which may or may not contain a failed core. Data Field with Padding 350 comprises Header 356, Pads 358, 362, 152A, 152B, 370, 374, Cores Scan Latches 360, 364, 368, 372 and Footer 376. Scan Chain Bits 354 denote the individual scan chain bit numbering within the above listed data field elements.

Data Field with Padding 350 is a variant of Data Field 300 with added padding latch groups that may be required to meet scan timing requirements. Unlike the cores, padding latch groups cannot be removed from the scan path, but remain to prevent a series of MUX delays, should a series of cores scan latches be removed from the chip scan path.

Referring now to FIG. 1, Scan Chain With Padding 150 depicts the insertion of Pad latches 152A, 152B in the scan path between Processor Core 1 104A and Processor Core 2 104B. The pad cells 152A, 152B are physically placed between Processor Cores 104A and 104B during the chip physical design, such that Propagation Delay Time (Tpd) 160 is less than the clock period of the scan clock, minus any latch setup time.

The purpose of pad cells 152A, 152B is to allow sequential cores of a scan chain to be located further apart than normal scan timing may allow, or to decrease the scan clock cycle time by decreasing the largest propagation delay between serial elements (latches or groups of latches) within a scan chain. Adding scan chain padding latches may also aid in scan timing closure when a failed core is removed (bypassed) out of the chip scan chain.

In one embodiment the design practice involves using an identical number of pad latches for every group of padding bits, so that one register in the scan controller can be used to contain the pad length (See FIG. 1,3, 4). It may simplify sequencer counting to include an equal pad section after the footer or before the header. One or more pad latches may be placed between sequential core scan latches of the scan chain.

Header 356 and Footer 376 latch groups may also be used as staging, or padding to adjust scan latch timing if needed. A header may be placed before the first core and a footer after the last core of the scan chain. Headers and footers may be of any length (number of bits).

Maintaining identical scan lengths for each type of element in the scan chain (Headers, Pad latch groups, Fail bits, Core groups, and Footers) is useful in keeping the scan chain controller from becoming overly complex. FIG. 1,3,4 illustrate this design practice.

A multi-core chip may include several sets of programmable registers, such as Scan Status Registers 302, which depicts a number of registers within the scan chain controller used for keeping track of the scan chain configuration (element lengths) and current status. Similarly, Scan Status Registers in Scan Status Registers 352 depicts similar registers as Scan Status Registers 302, with the addition of the Pad Length in Scan Status Registers 352, used to hold the length of the Pad 358, 362, 370, 374 scan latch groups.

FIG. 3 illustrates relationships between the data fields of exemplary scan Data Fields in 300 and 350 and corresponding Scan Status Registers (302, 352, respectively). Values contained in a Scan Status Registers 352, may for example represent the length of a particular element in a Data Fields 350, or they may represent a status parameter, such as the current number of scan clocks received for the associated Data field. A dotted line between a field in Data Fields 350, and corresponding Scan Status Registers 352, for example illustrates a relationship between the data field and an on-chip register.

For simplicity of illustration, only exemplary relationships are shown. Also, for simplicity, Data Field with Padding 350 and Scan Status Registers 352 will be discussed, as this pair includes all the data fields and corresponding Scan Status Registers 300, 302 pair.

The Header Length in Scan Status Registers 352 contains the length of the group of header latches at the beginning of the chip scan chain. The Core Length in Scan Status Registers 352 contains the number of core scan latches per core. The Footer Length in Scan Status Registers 352 contains the length of the group of footer latches at the end of the chip scan chain. The Pad Length in Scan Status Registers 352 contains the length of groups of scan chain latches used for scan related timing adjustment.

The Failed Cores in Scan Status Registers 352 contains a failed core bitmap, which is a collection of bits, each of which represents the functional or non-functional (failed) status of one core in the chip design. The failed core bit map register already exists for the current state of the art.

A failed core map contains information pertaining to the functional status of each core on the chip. Typically the information is binary in nature (functional or non-functional) but other are envisioned. Such embodiments may include a series of binary fields, or an analog parameter indicating various levels of functional ability, e.g.; maximum processor clock speed.

A failed core map may take the form of a failed core bitmap, a relatively simple arrangement of a single binary logic value assigned to represent the functional status (functional or non-functional) of each core in the design. One form of the bitmap is a vector (one-dimensional array) of binary values, forming a one-to-one correspondence to the functional status of each core in on the chip. Other embodiments are envisioned. Storage locations for a failed core map or bitmap may include but are not limited to files, registers, or any type of electronic data storage (memory) circuit.

In order for a scan controller to apply a failed core bitmap to a partially functional chip, it may have to receive the bitmap from an internal or external source. Internal sources may include an arrangement of fuses or other physically modified circuits, a non-volatile memory device (Flash memory), or a register loaded with the failed core bitmap.

Applying the failed core bitmap may also involve simply moving the bitmap from one location to another within the chip. External sources may include a service processor or other electronic device connected to a partially functional chip A failed core map location on a chip may include a partition of memory, a register, some sort of dynamic storage device (DRAM), non-volatile storage (Flash EEPROM), or other unspecified combination of active and passive electronic components.

The Shift Count in Scan Status Registers 352 represents the current number of (external) scan clocks received by the chip, regardless of whether the clocks are distributed to the scan latch chain or inhibited. Scan-in clocks may be provided by the service processor, or other hardware external to the chip. The count contained in the Shift Count in Scan Status Registers 352 may be used by the scan controller in updating the Pointer in Scan Status Registers 352.

The Pointer in Scan Status Registers 352 represents a pointer into the Failed Cores 252 register. Through a counting sequence that takes into account the above-listed length registers, the scan controller may update the pointer register with each shift clock received. The Pointer in Scan Status Registers 352 is kept in synchronization with the current core scan chain location corresponding to data being shifted into or out of the chip. The results of the Pointer in Scan Status Registers 352 pointing into Failed Cores in Scan Status Registers 352 is an indication (one specific bit of the failed core bit map) of the functional or non-functional (failed) status of the core currently being scanned into or out of.

Generally, the purpose of the registers containing lengths (Header Length, Core Length, Footer Length, Pad Length) is to enable the sequencing function of the scan chain controller to maintain synchronization with the implemented scan chain lengths. The sequencing function requires data descriptive of the length (in bits) of each scan chain element surrounding the scan chain of any potentially failed core in the design.

The register space Scan Status Registers 302 shown exists on the chip to allow a series of counters to determine the locations in the scan stream of each failing core. In this case a scan in will cause a count of the footer first, then each core then lastly the header. A failed core bitmap (loaded into the Failed Core in Scan Status Registers 302 register) can also be from a loaded register, internal fuse data, or some other source. When a failed core is indicated and matches the core that is being scanned, the on-chip scan clocks are disabled to the entire scan chain and the final output data from the part is held at 0. Note that a set fail bit retrieved in the scan data field did not actually come from the latch, but was injected in the data stream via the last hold signal into MUX 422 of FIG. 4.

The sequencing function makes use of all of the scan chain length data (contained in Length registers in Scan Status Registers 350) in the process of enabling/disabling on-chip scan clocks, loading failed core scan chains with constant values, and clocking out logical values in place of failed core scan chain data.

To illustrate an exemplary scan chain controller count sequence, Scan Status Registers 352 are used in conjunction with Data Field with Padding 350.

When the service processor begins shifting data into or out of a multi-core chip scan chain the Pointer register in Scan Status Registers 352 will initially point to the first bit of the Failed Core register in Scan Status Registers 352. With each shift clock cycle the Shift Count register in Scan Status Registers 352 will be incremented. When the Shift Count register in Scan Status Registers 352 reaches the value contained in the Core Length register in Scan Status Registers 352, the Shift Count register in Scan Status Registers 352 will be reset to 0 and the Pointer in Scan Status Registers 352 will be advanced to point at the next bit of the Failed Core register in Scan Status Registers 352.

Any time that the bit in the Failed Core register in Scan Status Registers 352 pointed to by the Pointer in Scan Status Registers 352 is active the scan controller logic will block the shift clocks from propagating to all the core latches. The Header Length in Scan Status Registers 352 and Footer Length in Scan Status Registers 352 registers are used in the case where there are additional staging latches in the scan path before the first core and after the last core. The Shift Count register in Scan Status Registers 352 must count these numbers of clock cycles before it counts the actual core length for purposes of advancing the pointer.

Figure 4:
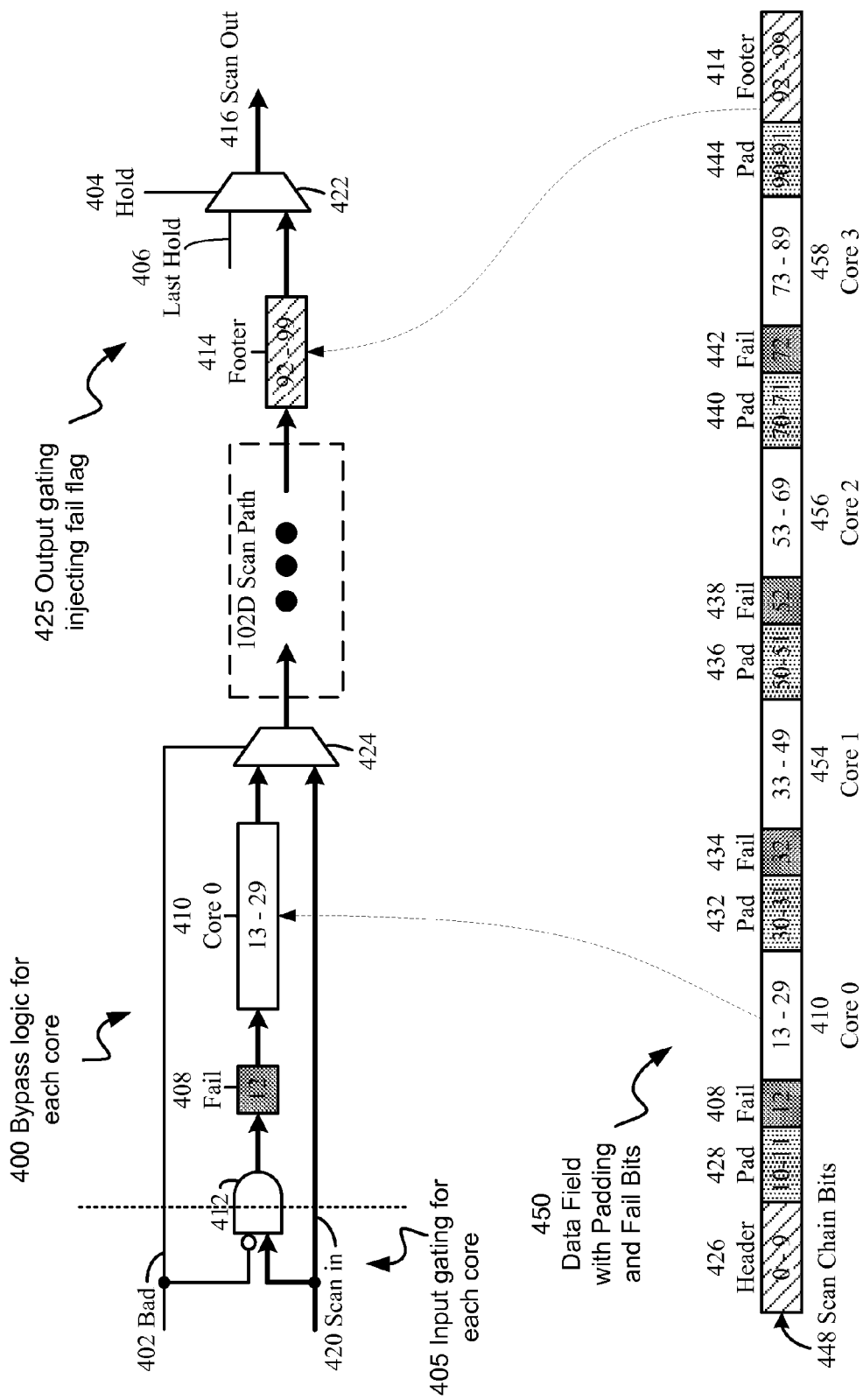
FIG. 4 is a block diagram representation of an exemplary scan path and associated data fields including headers, footers, pad bits, fail bits, and cores, according to further embodiments of the invention.

FIG. 4 is a block diagram representation of an exemplary scan path and associated data fields including headers, footers, pad bits, fail bits, and cores, according to further embodiments of the invention. FIG. 4 depicts further modifications to chip scan hardware in addition to those already depicted and discussed in reference to FIG. 2, that support embodiments of the invention.

Bypass logic for each core 400 is comprised of a Bad 402 signal, a Scan in 420 signal, an AND gate 412, a Fail bit 408, a Core 0 Scan Latches 410, and a MUX 424. When the Bad 402 signal is held at 1, the MUX 424 is used to select Scan in 420 as the input to MUX 424 rather than the output of the Scan Latches 410, effectively bypassing the Core 0 Scan Latches 410 in the scan path. There may be more than one failing core requiring bypassing; there is a similar arrangement activated for each failing core. Fail latch 408 is used to hold a bit indicating the functional status (functional or non-functional) of the core.

The Input gating 405 is comprised of Bad 402 signal, Scan in 420 signal, and AND gate 412. When the Bad 402 signal is held at 1, based on the contents of a failed core bitmap, the failing core's Core 0 Scan Latches 410 receive and are filled with 0s from the output of leading AND gate 412 preceding each core, during a scan in operation. When the Bad 402 signal is held at 0, the Core 0 410 would be loaded with the scan data then feeds the core following it in the scan chain. If the AND gate 412 was not preceding Core 0 410, then the failing core would be loaded with the same data as the core following it in the scan chain.

Input gating 405 may be used to scan in 0s during the time period in which the service processor would normally send scan input data to a failed core scan latch. The Input gating 405 illustrates how a core's scan chain may be filled with 0s. Other embodiments are contemplated that would fill a core's scan chain with 1's.

Output gating injecting fail flag 425 is comprised of Hold signal 404, Last Hold signal 406, MUX 422, and Scan Out 416. When Hold signal 404 is used to select Last Hold signal 406 as the MUX 422 input, the Scan Out 416 is held at the value present on Last Hold signal 406. This function may be used to scan out a constant logic value during the time period in which the service processor would normally receive scan outputs from a failed core scan latch, or may alternately be used to inject fail indication bits into the outgoing scan chain data, based on the contents of a failed core bitmap.

If the hold 404 signal selects the input from Footer 414, then the last bit of the previous core in the scan chain will be the constant value for the failed core's entire data field. During the time window when the failed core data is scanned out, the scan clocks are also held inactive in order to maintain the data of the previous core in the scan path to be scanned out when the scan resumes after the hold time.

Data Field with Padding and Fail Bits 450 is comprised of Header 426 field, Pad fields 428, 432, 436, 440, 444, Fail fields 408, 434, 438, 442, Core fields 410, 454, 456, 458 and Footer field 414. In addition to scan path field usage already depicted and discussed in reference to FIG. 3, the Fail fields 408, 434, 438, 442 have been added adjacent to core scan latches of the scan chain and are used to hold bits indicating the functional status (functional or non-functional) of each respective core.

Fail bits provide a service processor with a positive indication of core functional status; an all 0s field scanned out from a chip may just represent data that was resident in a core, regardless of the core's functional status. Thus service processor and associated software and firmware may use the fail bit fields contained in the scan out data to recognize a failing core.

Data Field with Padding and Fail Bits 450 depicts the data field that represents the added fail bits before each core. Note that the fail bit could alternatively be the last bit of the core data and the last hold above changed to first hold to inject the failing 1 indication at the beginning of the hold window.

Note that the fail bit is part of the core length loaded in the scan status and configuration registers before each scan. Also note that if there are sub-domains for any of these scan sections; cores, header and footer, they are handled by internal bypasses for that section of scan and a change in length loaded in the scan status and configuration registers.

The fail bits may be partitioned further with a different set for arrays, functional indication, and other uses. In this manner a failed array would not have to force the entire core to be labeled as failed, and the array repair data field could maintain its integrity. This implementation may ease software and firmware adaptations.

By masking the possible scan chain length variability from the service processor, the integrity of the scan chain (from the viewpoint of the service processor) is maintained. The bits targeted for various core scan chains reach their intended target latches, with no loss or misplacement of scan data during the process Scan Path 102D is similar to Scan Path 102A, 102B, 102C as described in reference to FIG. 1, FIG. 2. Footer latches 414 may be used to add delay to the output of Scan Path 102C for overall chip scan path timing.

Figure 5:
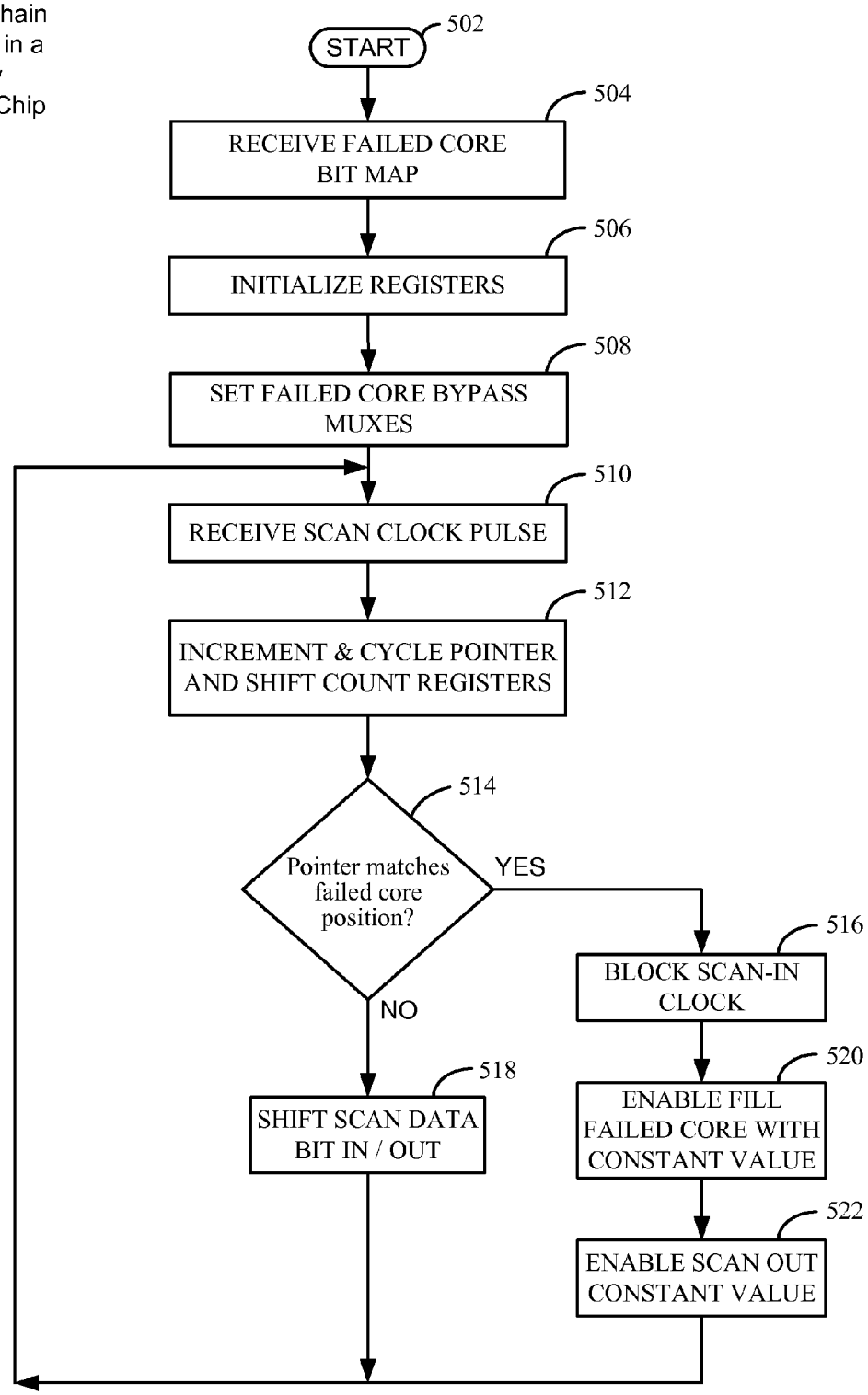
FIG. 5 is a flow diagram illustrating a method of scanning a partially functional chip, according to further embodiments of the invention.

FIG. 5 is a flow diagram illustrating a method of scan chain processing in a partially functional chip, according to further embodiments of the invention.

The process 500 moves from start 502 to operation 504. At operation 504 a failed core bitmap may be received. The information comprising the failed core bitmap may be received from manufacturing test results, dynamic chip runtime test results, internal fuse data and other sources, and may be scanned into the chip and loaded into a failed core register on the chip. Receiving the failed core bitmap from dynamic chip runtime test results allows the scan to continue to maintain its integrity as sections of a part fail during the life of the chip.

The process 500 then moves to operation 506. At operation 506 the scan path status and configuration registers are initialized, as described in reference to FIG. 3. Registers initialized may include Shift Count, Header Length, Core Length, Footer Length, Pad Length, Failed Cores, and Pointer in Scan Status Registers 352 (FIG. 3). Initializing values may be read from hardware, scanned in or read from fuses.

The Fail (FIG. 4, 408) bit is part of the core length loaded in the Core Length registers in Scan Status Registers 352 (FIG. 3) prior to each scan. Note that if there are subdomains for any of the cores, header or footer scan sections, they are handled by internal bypasses for that section of scan and a change in length loaded into the scan registers. The Pointer register in Scan Status Registers 352 (FIG. 3) will initially point to the first bit of the failed core bitmap in the Failed Cores register.

The process 500 then moves to operation 508. At operation 508, bypassing at least one failed core scan chain includes referencing the failed core bitmap contained in the Failed Cores in Scan Status Registers 352 (FIG. 3) register (FIG. 3). A multiplexer (MUX) may be used to select an alternate scan path to the failed core scan chain, but other means may be used. See Bypass logic 200, 400 in FIG. 2, 4, respectively for details on the bypassing circuitry.

The process 500 then moves to operation 510. At operation 510 the scan controller regularly receives scan clock pulses from service processor through inputs to the chip.

The process 500 then moves to operation 512. At operation 512 at each shift clock input the Shift Count in Scan Status Registers 352 (FIG. 3) will be incremented. When the Shift Count in Scan Status Registers 352 (FIG. 3) register (FIG. 3) reaches the value contained in the Core Length register in Scan Status Registers 352 (FIG. 3), the Shift Count in Scan Status Registers 352 (FIG. 3) will be reset to 0 and the Pointer in Scan Status Registers 352 (FIG. 3) will be advanced to point at the next bit of the Failed Cores register in Scan Status Registers 352 (FIG. 3).

The Header Length in Scan Status Registers 352 (FIG. 3) and Footer Length in Scan Status Registers 352 (FIG. 3) registers are used in the case where there are additional staging latches in the scan path before the first core and after the last core. The Shift Count in Scan Status Registers 352 (FIG. 3) register must count these numbers of clock cycles before it counts the actual core length for purposes of advancing the pointer.

The process 500 then moves to decision 514. At decision 514, when the value of the Pointer in Scan Status Registers 352 (FIG. 3) register (scan status information) indicates that failed core bits are being currently scheduled to be sent or received by the chip (scanned) masking the shift operation occurs, starting with operation 516.

If the value of the Pointer in Scan Status Registers 352 (FIG. 3) register (scan status information) does not indicate that failed core bits are being currently sent or received by the chip (scanned), then process 500 moves to operation 518. At operation 518 a normal scan operation occurs of scan bits from operational cores, with no bits from failed cores being scanned in or out.

Following operation 518, the process 500 then moves to operation 510 to receive another scan clock pulse.

Operations 516, 520, and 522 together comprise masking the shift operation of the failed cores from the service processor. At operation 516, the scan clocks for all latches in the scan chain are disabled.

The process 500 then moves to operation 520. At operation 520 the failed core is filled with a constant logic value during the scan in operation. (See FIG. 2 for details.)

The process 500 then moves to operation 522. At operation 522 a constant logic value is output from the chip in place of a failed core's scan data during the scan out operation. (See FIG. 2 for details.)

Following operation 522, the process 500 then moves to operation 510 to receive another scan clock pulse.

Although the present invention has been described in terms of specific embodiments, it is anticipated that alterations and modifications thereof may become apparent to those skilled in the art. Therefore, it is intended that the following claims be interpreted as covering all such alterations and modifications as fall within the true spirit and scope of the invention.

What is claimed is:

1. A scan chain controller, comprising:
a scan chain that includes a plurality of utility scan latches, the plurality of utility scan latches having at least one pad latch between a plurality of core scan latches and at least one fail latch adjacent to the plurality of core scan latches, the at least one fail latch configured to indicate a functional status of a core;
a bypass logic coupled to the scan chain to redirect a scan path of the scan chain, around a core scan latch of a failed core, the core scan latch of the failed core located within the scan chain;
an input gating logic coupled to the bypass logic to fill the core scan latch of the failed core with a constant logic value;
an output gating logic coupled to the bypass logic to insert a constant logic value in place of outputs of the core scan latch of the failed core; and
a set of scan path status and configuration registers operationally coupled to the input gating logic, the bypass logic and the output gating logic, the set of scan path status and configuration registers including a shift count register, a header length register, a core length register, a footer length register, a pad length register, and a failed core register.

* * * * *